United States Patent
Dorman et al.

(10) Patent No.: US 11,449,262 B1
(45) Date of Patent: Sep. 20, 2022

(54) OPTIMAL AND DYNAMIC SELECTION OF COMPRESSION DICTIONARY SIZE AND DATA BUFFER COALESCE INFRASTRUCTURE FOR GREATER DATA REDUCTION AND LOWERED NETWORK BANDWIDTH USAGE OF REMOTE DATA FACILITY REPLICATION SYSTEMS

(71) Applicant: EMC IP HOLDING COMPANY LLC, Hopkinton, MA (US)

(72) Inventors: Kenneth Dorman, West Brookfield, MA (US); Venkata Ippatapu, Westborough, MA (US)

(73) Assignee: Dell Products L.P., Hopkinton, MA (US)

( * ) Notice: Subject to any disclaimer, the term of this patent is extended or adjusted under 35 U.S.C. 154(b) by 89 days.

(21) Appl. No.: 17/206,867

(22) Filed: Mar. 19, 2021

(51) Int. Cl.
G06F 12/00 (2006.01)
G06F 3/06 (2006.01)
H03M 7/30 (2006.01)

(52) U.S. Cl.
CPC .............. G06F 3/065 (2013.01); G06F 3/067 (2013.01); G06F 3/0608 (2013.01); G06F 3/0656 (2013.01); G06F 3/0659 (2013.01); G06F 3/0689 (2013.01); H03M 7/3088 (2013.01)

(58) Field of Classification Search
CPC ...... G06F 3/065; G06F 3/0608; G06F 3/0656; G06F 3/0659; G06F 3/067; G06F 3/0689; H03M 7/3088

USPC .......................................................... 711/100
See application file for complete search history.

(56) References Cited

U.S. PATENT DOCUMENTS 7,263,107 B1 * 8/2007 Johnston .............. H04L 65/1101
370/467

FOREIGN PATENT DOCUMENTS

CN 105741095 A * 7/2016

* cited by examiner

Primary Examiner — Mardochee Chery
(74) Attorney, Agent, or Firm — Anderson Gorecki LLP

(57) ABSTRACT

Storage arrays in a mirror relationship use dynamic compression dictionary size adjustment and data buffer merging to more efficiently compress data associated with maintenance of consistency of a replicated storage object. A compression dictionary size selector selects a supported compression dictionary size based on the aggregate size of the updates enqueued for transmission in the data buffers, e.g., a compression dictionary size that is greater than or equal to, and as close as possible to, the aggregate size of the enqueued updates. A combiner selects enqueued updates based on the selected compression dictionary size, e.g., aggregate enqueued update size less than or equal to, and as close as possible to, the selected compression dictionary size. The selected updates are coalesced and compressed using the selected compression dictionary size.

20 Claims, 4 Drawing Sheets

OPTIMAL AND DYNAMIC SELECTION OF COMPRESSION DICTIONARY SIZE AND DATA BUFFER COALESCE INFRASTRUCTURE FOR GREATER DATA REDUCTION AND LOWERED NETWORK BANDWIDTH USAGE OF REMOTE DATA FACILITY REPLICATION SYSTEMS

TECHNICAL FIELD

The subject matter of this disclosure is generally related to electronic data storage, and more particularly to compression of data transmitted between storage systems that maintain replicated storage objects.

BACKGROUND

Storage area networks (SANs) and storage arrays are used to maintain large storage objects and contemporaneously support multiple host applications. A storage array includes a network of interconnected compute nodes that manage access to host application data stored on arrays of non-volatile drives. The compute nodes access the data in response to input-output commands (IOs) from host applications that are typically run by servers known as "hosts." Examples of host applications may include, but are not limited to, software for email, accounting, manufacturing, inventory control, and a wide variety of other business processes.

Paired storage arrays can be configured as mirrors that replicate a storage object. In an active-active configuration the host servers can send IOs to either storage array and access both replicas contemporaneously. In an active-passive configuration the host servers can only access a primary storage array that maintains the active replica. However, the passive replica on the secondary storage array can quickly be made active. Consequently, storage object replication can be useful for disaster recovery, parallel processing, and migration. Because host applications typically update storage objects on a regular basis, such as by writing to the storage object, the paired storage arrays often exchange updates to maintain consistency between the replicas. Updates exchanged between the primary and secondary storage arrays may be synchronous or asynchronous. In general, latency may be of greater concern in a synchronous configuration. Data compression is used to reduce bandwidth requirements and latency of updates.

SUMMARY

In accordance with some aspects of the invention a method comprises: repeatedly, and responsive to replica updates being enqueued for transmission to a mirror: determining an aggregate size of the replica updates enqueued for transmission; selecting a compression dictionary size based on the aggregate size of the replica updates enqueued for transmission; selecting ones of the replica updates enqueued for transmission based on the selected compression dictionary size; coalescing the selected ones of the replica updates; compressing the coalesced replica updates using the selected compression dictionary size; and providing the compressed coalesced replica updates to the mirror.

In accordance with some aspects of the invention an apparatus comprises: at least one compute node configured to maintain a replicated storage object, the compute node comprising: data buffers configured to store enqueued updates to the replicated storage object; a compression dictionary size selector configured to select a compression dictionary size based on aggregate size of the updates enqueued for transmission in the data buffers; a combiner configured to select ones of the updates enqueued for transmission based on the selected compression dictionary size and coalesce the selected ones of the updates; and a data reduction module configured to compress the coalesced updates using the selected compression dictionary size; wherein the compressed coalesced updates are provided to a mirror.

In accordance with some implementations a computer-readable storage medium stores instructions that when executed by a computer cause the computer to perform a method for generating compressed replication data, the method comprising: repeatedly, and responsive to replica updates being enqueued for transmission to a mirror: determining an aggregate size of the replica updates enqueued for transmission; selecting a compression dictionary size based on the aggregate size of the replica updates enqueued for transmission; selecting ones of the replica updates enqueued for transmission based on the selected compression dictionary size; coalescing the selected ones of the replica updates; compressing the coalesced replica updates using the selected compression dictionary size; and providing the compressed coalesced replica updates to the mirror.

All examples, aspects and features mentioned in this document can be combined in any technically possible way. Other aspects, features, and implementations may become apparent in view of the detailed description and figures.

DETAILED DESCRIPTION

The terminology used in this disclosure is intended to be interpreted broadly within the limits of subject matter eligibility. The terms "disk" and "drive" are used interchangeably herein and are not intended to refer to any specific type of non-volatile storage media. The terms "logical" and "virtual" are used to refer to features that are abstractions of other features, e.g., and without limitation abstractions of tangible features. The term "physical" is used to refer to tangible features that possibly include, but are not limited to, electronic hardware. For example, multiple virtual computers could operate simultaneously on one physical computer. The term "logic" is used to refer to special purpose physical circuit elements, firmware, software, computer instructions that are stored on a non-transitory computer-readable medium and implemented by multi-purpose tangible processors, and any combinations thereof. Aspects of the inventive concepts are described as being implemented in a data storage system that includes host servers and a storage array. Such implementations should not be viewed as limiting. Those of ordinary skill in the art will recognize that there are a wide variety of implementations of the inventive concepts in view of the teachings of the present disclosure.

Some aspects, features, and implementations described herein may include machines such as computers, electronic components, optical components, and processes such as computer-implemented procedures and steps. It will be apparent to those of ordinary skill in the art that the computer-implemented procedures and steps may be stored as computer-executable instructions on a non-transitory computer-readable medium. Furthermore, it will be understood by those of ordinary skill in the art that the computer-executable instructions may be executed on a variety of tangible processor devices, i.e., physical hardware. For practical reasons, not every step, device, and component that may be part of a computer or data storage system is described herein. Those of ordinary skill in the art will recognize such steps, devices, and components in view of the teachings of the present disclosure and the knowledge generally available to those of ordinary skill in the art. The corresponding machines and processes are therefore enabled and within the scope of the disclosure.

Figure 1:
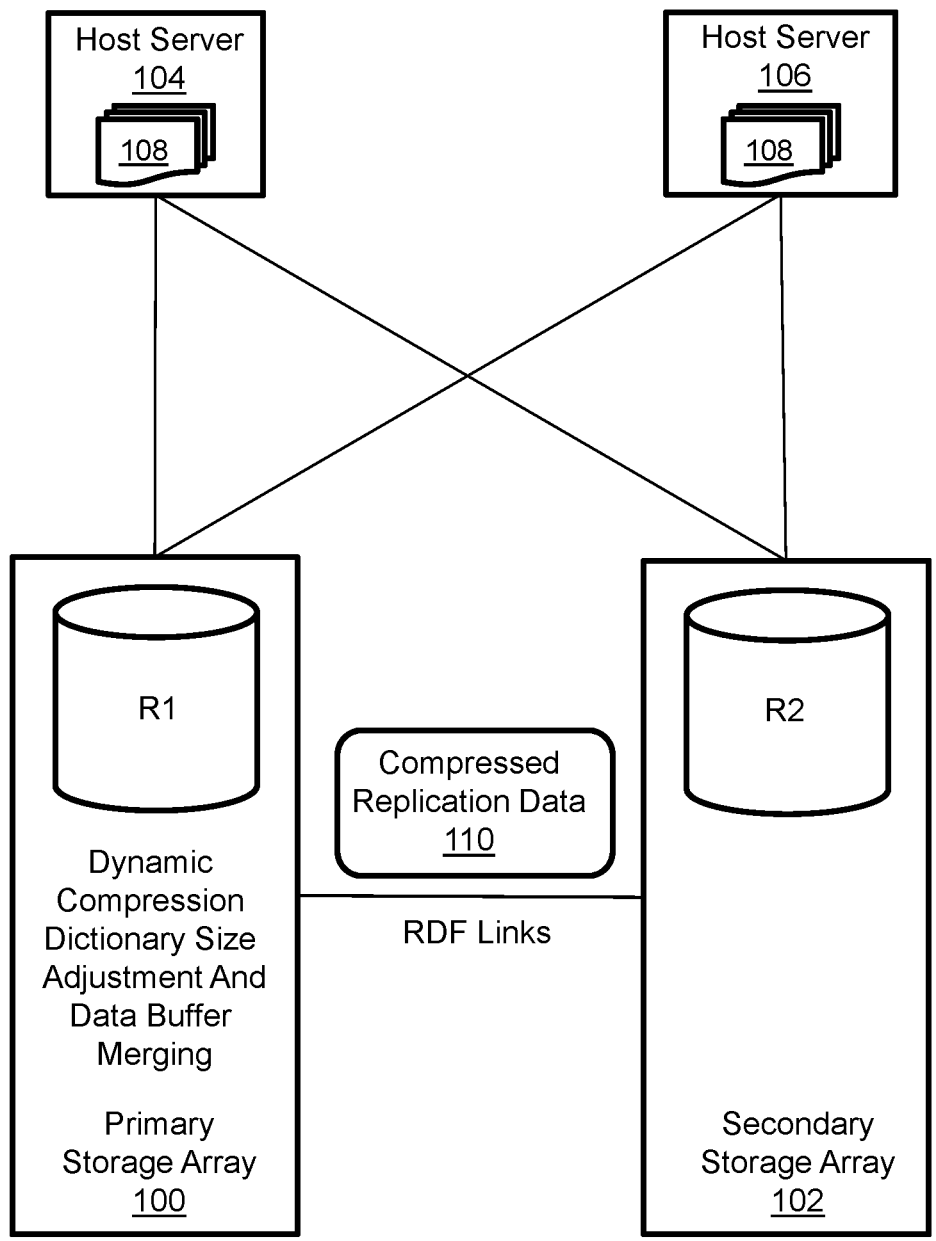
FIG. 1 illustrates two storage arrays using dynamic compression dictionary size adjustment and data buffer merging to more efficiently compress data associated with maintenance of consistency of a replicated storage object.

FIG. 1 illustrates two storage arrays in a mirror relationship using dynamic compression dictionary size adjustment and data buffer merging to more efficiently compress data associated with maintenance of consistency of a replicated storage object. For context, and without limitation, an active-passive configuration will be described. A primary storage array 100 maintains an active replica R1 and a secondary storage array 102 maintains a corresponding passive replica R2, i.e., R1 and R2 are replicas of the same storage object. Host servers 104, 106 run instances of a host application 108. Host application data is maintained on the replicated storage object. The instances of the host application prompt generation of IOs that are sent to the primary storage array 100 and serviced by replica R1. Replica R1 is updated by IOs such as Writes sent from the host applications to the primary storage array. In order to maintain consistency between replica R1 and replica R2, the primary storage array sends compressed replication data 110 corresponding to the writes to the secondary storage array 102. The secondary storage array uses the compressed replication data 110 to update replica R2.

Replication data is compressed using a lossless compression algorithm, of which the storage arrays 100, 102 may support more than one, e.g., XP10, GZIP, etc. Individual compression algorithms may each support multiple compression dictionary sizes, and different compression algorithms may support different compression dictionary sizes. The compression dictionary size, including sliding window size, defines the amount of data that the compression algorithm processes in one compression cycle to identify statistical redundancy and generate a single compressed output record that can be decompressed as a whole. For example, the data of a portion of a string that fits within the sliding window is compressed and then the sliding window is moved to compress a different portion of the string that fits within the sliding window. In prior implementations the compression dictionary size used to compress replication data was static. The static compression dictionary size was selected based on a default fixed size determined by compression algorithm implementations on storage array architecture, eHowever, updates to replicated storage objects are not made at a fixed rate and in fixed sizes so the amount of replication data that needs to be compressed and shared is not static and the number of buffers populated with replication data varies over time. Such variability leads to inefficient compression. More efficient compression can be achieved by adjusting the compression dictionary size as a function of the total size of the replication data enqueued for compression and various sliding window sizes (compression dictionary sizes) supported by compression algorithm used for replication. Data buffers are then coalesced as a function of the selected compression dictionary size and the compression algorithm processes the coalesced replication data to generate a unit of more efficiently compressed replication data.

Figure 2:
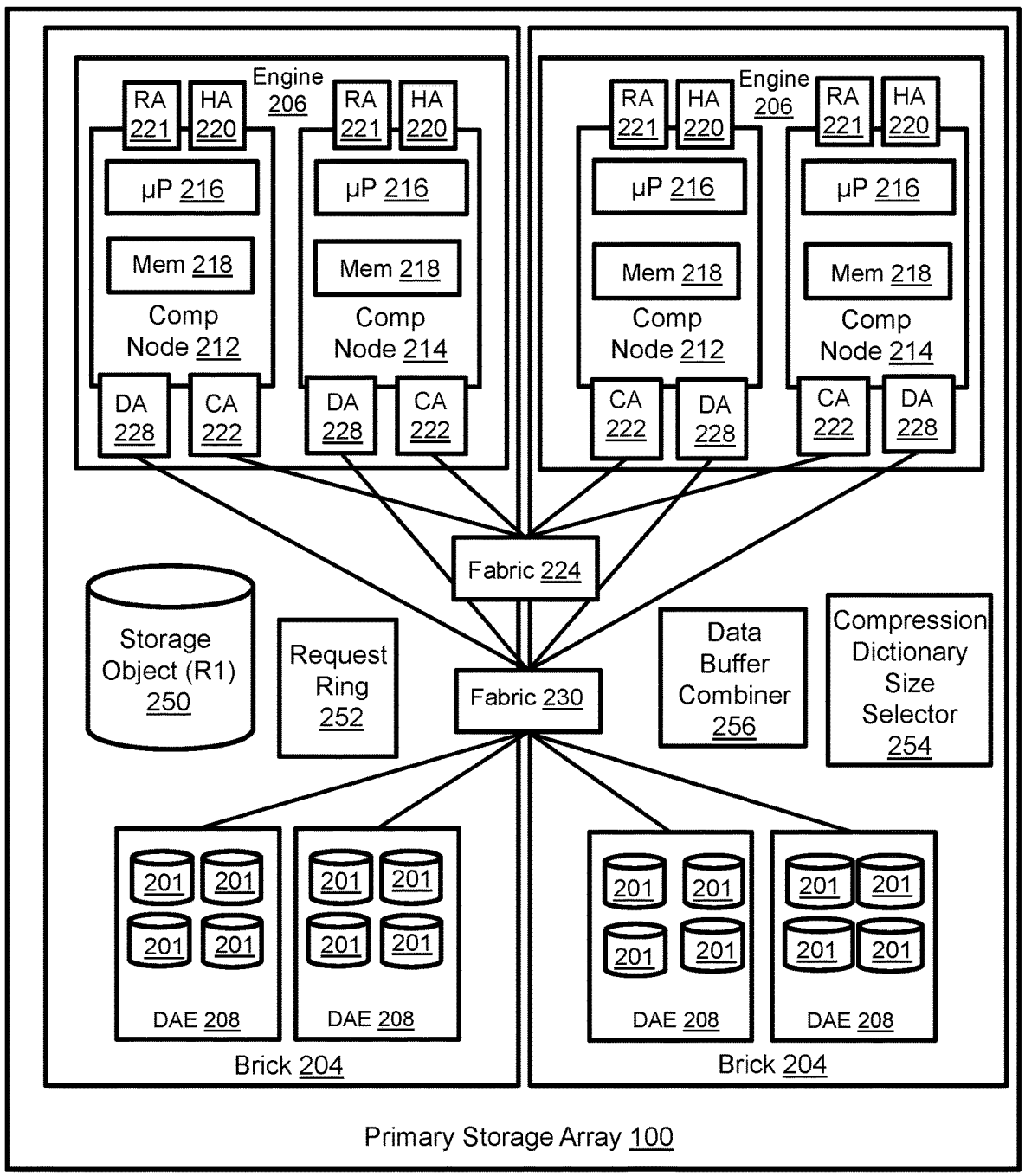
FIG. 2 illustrates the primary storage array in greater detail.

FIG. 2 illustrates the primary storage array 100 in greater detail, although both storage arrays may be architecturally similar or identical. The storage array includes one or more bricks 204. Each brick includes an engine 206 and one or more drive array enclosures (DAEs) 208. Each engine 206 includes a pair of compute nodes 212, 214 that are interconnected via point-to-point links and arranged in a failover relationship. The compute nodes may be referred to as "storage directors" or simply "directors." Although it is known in the art to refer to the compute nodes of a SAN as "hosts," that naming convention is avoided in this disclosure to help distinguish the host servers from the compute nodes 212, 214. Nevertheless, the host applications could run on the compute nodes, e.g., on virtual machines or in containers. Each compute node includes resources such as at least one multi-core processor 216 and local memory 218. The processor may include central processing units (CPUs), graphics processing units (GPUs), or both. The local memory 218 may include volatile media such as dynamic random-access memory (DRAM), non-volatile memory (NVM) such as storage class memory (SCM), or both. Each compute node includes one or more host adapters (HAs) 220 for communicating with the host servers 104, 106 (FIG. 1). Each host adapter has resources for servicing IO commands from the host servers. The host adapter resources may include processors, volatile memory, and ports via which the hosts may access the storage array. Each compute node also includes a remote adapter (RA) 221 for communicating with other storage systems such as secondary storage array 102 (FIG. 1), e.g., for remote mirroring, backup, and replication. Each compute node also includes one or more drive adapters (DAs) 228 for communicating with managed drives 201 in the DAEs 208. Each drive adapter has processors, volatile memory, and ports via which the compute node may access the DAEs for servicing IOs. Each compute node may also include one or more channel adapters (CAs) 222 for communicating with other compute nodes via an interconnecting fabric 224. The managed drives 201 include non-volatile storage media such as, without limitation, solid-state drives (SSDs) based on EEPROM technology such as NAND and NOR flash memory and hard disk drives (HDDs) with spinning disk magnetic storage media. Drive controllers may be associated with the managed drives as is known in the art. An interconnecting fabric 230 enables implementation of an N-way active-active backend. A backend connection group includes all drive adapters that can access the same drive or drives. In some implementations every drive adapter 228 in the storage array can reach every DAE via the fabric 230. Further, in some implementations every drive adapter in the storage array can access every managed drive 201.

Referring to FIGS. 1 and 2, data associated with instances of the host application 108 running on the host servers 104, 106 is maintained on the managed drives 201. The managed drives 201 are not discoverable by the host servers but the storage array 100 creates a storage object 250 that can be discovered and accessed by the host servers. Without limitation, the storage object may be referred to as a production device, logical volume, source device, production volume, or production LUN, where the logical unit number (LUN) is a number used to identify logical storage volumes in accordance with the small computer system interface (SCSI) protocol. The storage object 250 is replicated and the version on storage array 100 is replica R1 whereas the version on storage array 102 is replica R2. From the perspective of the host servers, the storage object (and replica R1) is a single drive having a set of contiguous fixed-size logical block addresses (LBAs) on which data used by the instances of the host application resides. However, the host application data is stored at non-contiguous addresses on various managed drives 201. The compute nodes maintain metadata that maps between the storage object and the managed drives 201 in order to process IOs from the host servers.

In response to data updates of replica R1 resulting from IOs sent to the primary storage array 100 by the host servers, which may occur continually and with varying burstiness, the storage array 100 enqueues data updates in a request ring 252. The enqueued updates are selectively compressed and provided as compressed replication data to the secondary storage array. In order to generate a unit of compressed replication data, a compression dictionary size selector 254 dynamically selects a compression dictionary size based on the compression dictionary sizes supported by the compression algorithms available to the storage arrays and the total size of the replication data enqueued in the request ring when the dictionary size is selected. If possible, the dictionary size is selected to be larger than, but as close as possible to, the total size of the replication data enqueued in the request ring when the dictionary size is selected. A data buffer combiner 256 then coalesces a selected amount of the replication data that is as close as possible to, but not greater than, the selected dictionary size. The replication data is then compressed and sent to the secondary storage array.

Figure 3:
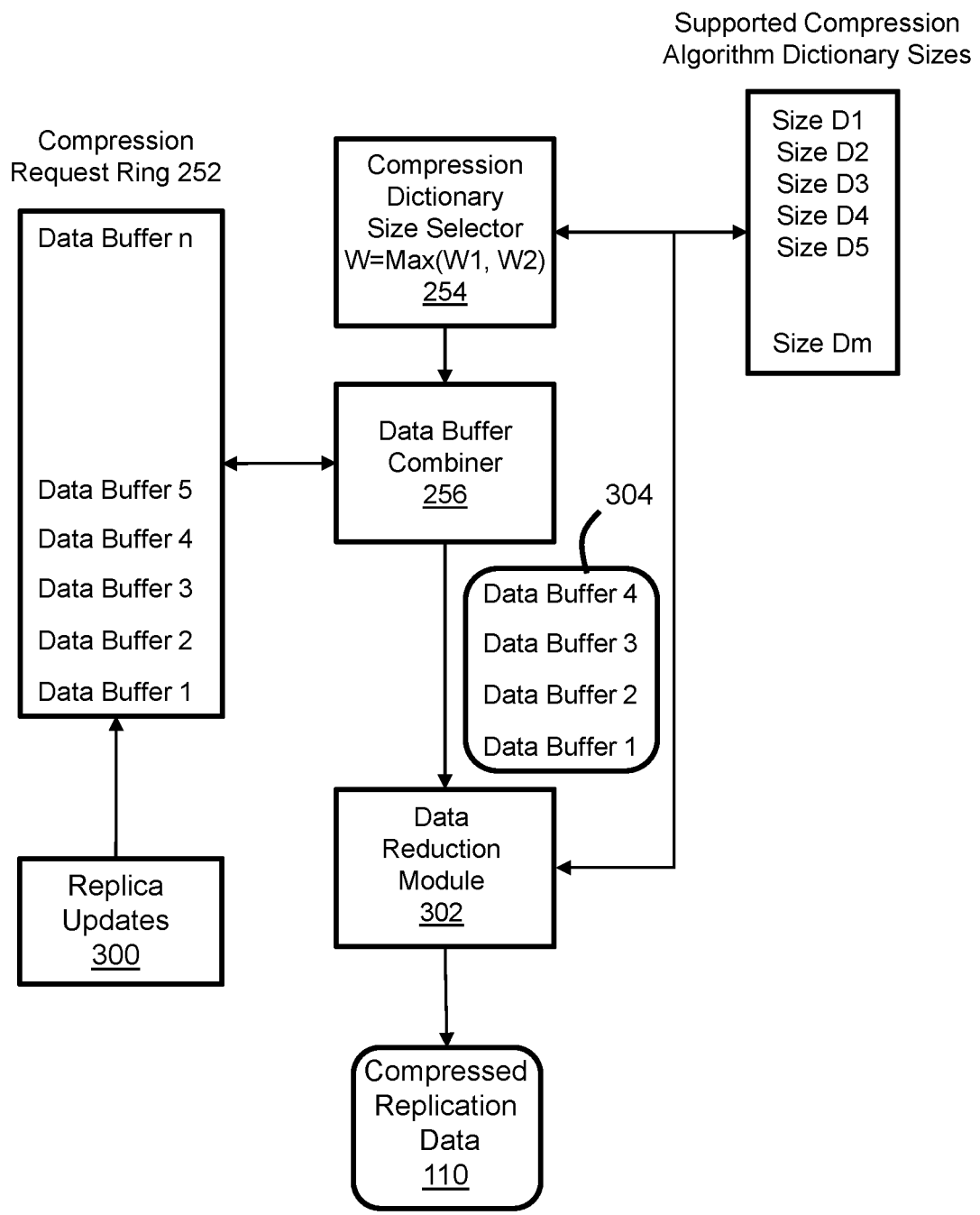
FIG. 3 illustrates operation of the compression dictionary size selector and data buffer combiner.

FIG. 3 illustrates operation of the compression dictionary size selector and data buffer combiner. Replica updates 300 are enqueued in data buffers of the compression request ring 252. The data buffers may all have the same fixed size, and the request ring may include a fixed number n of available data buffers. In the illustrated example, data buffers 1-5 are populated with replica updates. A data reduction module 302 performs compression and may support multiple compression algorithms and multiple dictionary sizes D1-Dm. In the illustrated example the supported compression dictionary sizes are D1-D5, where D1=4 KB, D2=8 KB, D3=64 KB, D4=128 KB, and D5=1 MB. The compression dictionary size selector 254 dynamically selects the size of the compression dictionary that is used by the data reduction module 302, where "dynamically" means that it is automatically adjusted in response to current conditions. The selected compression dictionary size W is the greater of W1 and W2, i.e., W=Max (W1, W2), where W2 is the first available supported dictionary size that is greater than or equal to the total size of data enqueued in the compression request ring or the maximum supported dictionary size. Mathematically, W2=(First Ds≥S)?Ds: Dm. The total size of the data enqueued in the compression request ring may be estimated based on the number of populated data buffers and data buffer size, e.g., Queued Ring Size (S)=length of data buffer 1+length of data buffer 2+. W1 is the minimum supported dictionary size. Mathematically, W1=Min (D1, D2, D3, . . . Dm). For W2 size determination, if the total size of the replica updates enqueued in the compression request ring is 4 KB, dictionary size D1 is selected, if the total size of the replica updates enqueued in the compression request ring is 16 KB, dictionary size D3 is selected, if the total size of the replica updates enqueued in the compression request ring is 256 KB, dictionary size D5 is selected, and if the total size of the replica updates enqueued in the compression request ring is 100 MB, dictionary size D5 is selected. The W1 option may be suitable for implementations that are memory-bound, may have performance implications with higher dictionary sizes or support few dictionary sizes. An indication of the selected compression dictionary size is provided to the data buffer combiner 256 and the data reduction module 302 by the compression dictionary size selector 254.

The data buffer combiner 256 is responsive to the indication of the selected compression dictionary size to select, list, and coalesce a corresponding number of the populated data buffers in the compression request ring. The data buffers are selected such that aggregate size of the data of the listed buffers is less than or equal to the selected compression dictionary size W. The rational in selecting the data size of the list to be less than or equal to the selected compression dictionary size is to enable the compression algorithm to search for statistical redundancies across the largest possible data set without inclusion of additional data that exceeds the search capacity of the compression algorithm as defined by the compression dictionary/sliding window size. For example, if the selected compression dictionary size W is 128 KB and there are 100×4 KB data buffers in the ring then the data buffer combiner 256 selects the first 32 data buffers 1-32. The data buffers are placed in a list and then the listed data buffers are coalesced and provided to the data reduction module 302. In the illustrated example data buffers 1 through 4 are listed and combined into coalesced data buffers 304.

The data reduction module 302 compresses the coalesced data buffers 304 using the dynamically selected compression dictionary size. The final compression ratio CR can be expressed as: CR=Size of data buffer list comprising N coalesced data buffers/Compressed data size. The compression ratio achieved with N coalesced data buffers using dynamically selected compression dictionary size W is better than the compression ratio obtained by individually compressing data buffers with a static dictionary size.

Figure 4:
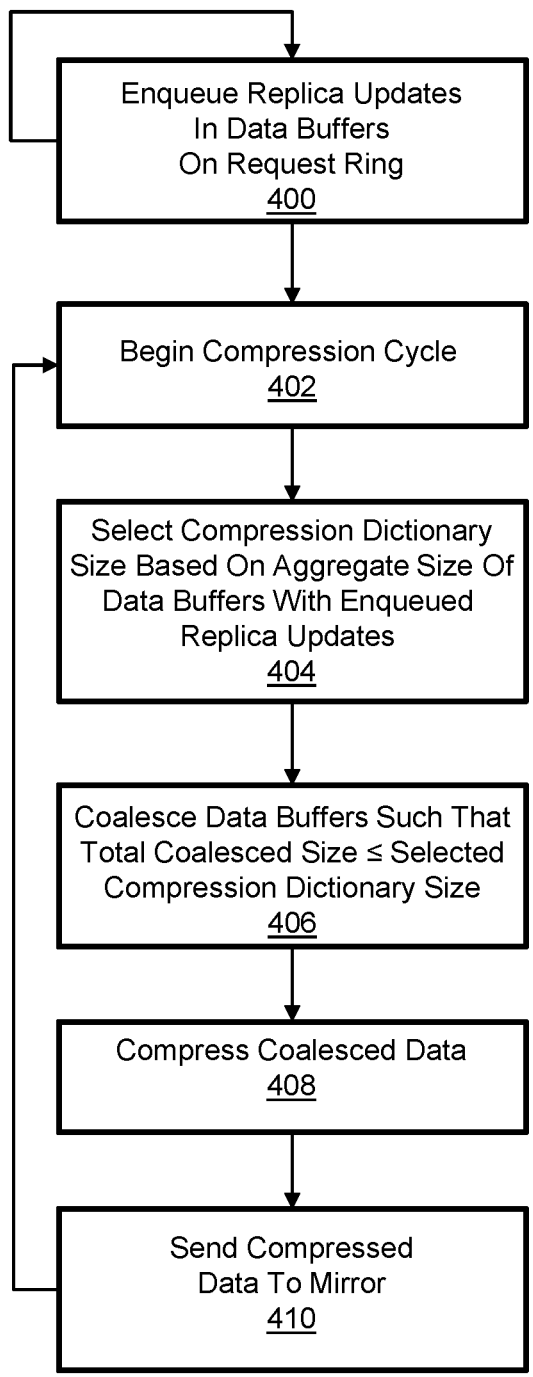
FIG. 4 illustrates steps associated with dynamic compression dictionary size adjustment and data buffer merging.

FIG. 4 illustrates steps associated with dynamic compression dictionary size adjustment and data buffer merging. Replica updates are enqueued in data buffers of the request ring as indicated in step 400. Enqueueing of replica updates is ongoing and happens independently from compression cycles. A compression cycle begins at step 402 using the current state of the request ring. Step 404 is selecting the compression dictionary size based on the aggregate size of the data buffers enqueued with replica updates. If possible with the supported compression dictionary sizes, the compression dictionary size is selected to be greater than or equal to, and as close as possible to, the aggregate size of the data buffers enqueued with replica updates. Otherwise, a supported compression dictionary size may be selected that is less than the aggregate size of the data buffers enqueued with replica updates that may degrade compression ratio and performance. Step 406 is selecting, listing, and coalescing data buffers. Data buffers are selected such that the aggregate size of the selected data buffers is less than or equal to, and as close as possible to, the size of the selected compression dictionary. The selected data buffers are listed and coalesced into a single data compression unit. Step 408 is compressing the coalesced data. The coalesced data is compressed using the selected compression dictionary size. Step 410 is sending the compressed data to the mirror. The compression cycle is then repeated using the new current state of the request ring. Because the state of the request ring changes over time, the selected compression dictionary size and number of data buffers that are coalesced may vary from over time, e.g., between successive compression cycles.

Specific examples have been presented to provide context and convey inventive concepts. The specific examples are not to be considered as limiting. A wide variety of modifications may be made without departing from the scope of the inventive concepts described herein. Moreover, the features, aspects, and implementations described herein may be combined in any technically possible way. Accordingly, modifications and combinations are within the scope of the following claims.

What is claimed is:

1. A method, comprising:
   repeatedly, and responsive to replica updates being enqueued for transmission to a mirror:
   determining an aggregate size of the replica updates enqueued for transmission;
   selecting a compression dictionary size based on the aggregate size of the replica updates enqueued for transmission;
   selecting ones of the replica updates enqueued for transmission based on the selected compression dictionary size;
   coalescing the selected ones of the replica updates;
   compressing the coalesced replica updates using the selected compression dictionary size; and
   providing the compressed coalesced replica updates to the mirror.

2. The method of claim 1 comprising selecting the compression dictionary size from a plurality of supported compression dictionary sizes.

3. The method of claim 2 comprising selecting the supported compression dictionary size that is greater than or equal to, and as close as possible to, the aggregate size of the replica updates enqueued for transmission.

4. The method of claim 2 comprising selecting the supported compression dictionary size that is a maximum supported compression dictionary size responsive to one of the supported compression dictionary sizes being greater than or equal to the aggregate size of the replica updates enqueued for transmission.

5. The method of claim 2 comprising selecting the supported compression dictionary size that is a minimum supported compression dictionary size.

6. The method of claim 1 comprising selecting the ones of the replica updates enqueued for transmission such that aggregate size of the selected ones of the replica updates is less than or equal to, and as close as possible to, the selected compression dictionary size.

7. The method of claim 1 comprising determining the aggregate size of the replica updates enqueued for transmission based on number of populated data buffers and data buffer size.

8. An apparatus, comprising:
   at least one compute node configured to maintain a replicated storage object, the compute node comprising:
   data buffers configured to store enqueued updates to the replicated storage object;
   a compression dictionary size selector configured to select a compression dictionary size based on aggregate size of the updates enqueued for transmission in the data buffers;
   a combiner configured to select ones of the updates enqueued for transmission based on the selected compression dictionary size and coalesce the selected ones of the updates; and
   a data reduction module configured to compress the coalesced updates using the selected compression dictionary size;
   wherein the compressed coalesced updates are provided to a mirror.

9. The apparatus of claim 8 wherein the compression dictionary size selector is configured to select the compression dictionary size from a plurality of supported compression dictionary sizes.

10. The apparatus of claim 9 wherein the compression dictionary size selector is configured to select the supported compression dictionary size that is greater than or equal to, and as close as possible to, the aggregate size of the replica updates enqueued for transmission.

11. The apparatus of claim 9 wherein the compression dictionary size selector is configured to select the supported compression dictionary size that is a maximum supported compression dictionary size responsive to one of the supported compression dictionary sizes being greater than or equal to the aggregate size of the replica updates enqueued for transmission.

12. The apparatus of claim 9 wherein the compression dictionary size selector is configured to select the supported compression dictionary size that is a minimum supported compression dictionary size responsive to available memory limitations.

13. The apparatus of claim 8 wherein the combiner is configured to select the ones of the updates enqueued for transmission such that aggregate size of the selected ones of the updates is less than or equal to, and as close as possible to, the selected compression dictionary size.

14. The apparatus of claim 8 wherein the combiner is configured to determine the aggregate size of the replica updates enqueued for transmission based on a number of populated data buffers and data buffer size.

15. A computer-readable storage medium storing instructions that when executed by a computer cause the computer to perform a method for generating compressed replication data, the method comprising:
   repeatedly, and responsive to replica updates being enqueued for transmission to a mirror:
   determining an aggregate size of the replica updates enqueued for transmission;
   selecting a compression dictionary size based on the aggregate size of the replica updates enqueued for transmission;
   selecting ones of the replica updates enqueued for transmission based on the selected compression dictionary size;
   coalescing the selected ones of the replica updates;
   compressing the coalesced replica updates using the selected compression dictionary size; and
   providing the compressed coalesced replica updates to the mirror.

16. The computer-readable storage medium of claim 15 wherein the method comprises selecting the compression dictionary size from a plurality of supported compression dictionary sizes.

17. The computer-readable storage medium of claim 16 wherein the method comprises selecting the supported compression dictionary size that is greater than or equal to, and as close as possible to, the aggregate size of the replica updates enqueued for transmission.

18. The computer-readable storage medium of claim 16 wherein the method comprises selecting the supported compression dictionary size that is a maximum supported compression dictionary size responsive to one of the supported compression dictionary sizes being greater than or equal to the aggregate size of the replica updates enqueued for transmission.

19. The computer-readable storage medium of claim 16 wherein the method comprises selecting the supported compression dictionary size that is a minimum supported compression dictionary size.

20. The computer-readable storage medium of claim 15 wherein the method comprises selecting the ones of the replica updates enqueued for transmission such that aggregate size of the selected ones of the replica updates is less than or equal to, and as close as possible to, the selected compression dictionary size.

\* \* \* \* \*